(12) United States Patent
Essary

(10) Patent No.: US 11,823,826 B2
(45) Date of Patent: *Nov. 21, 2023

(54) LATCHING DEVICE FOR PAD-MOUNTED TRANSFORMERS AND OTHER SIMILAR EQUIPMENT

(71) Applicant: Howard Industries, Inc., Ellisville, MS (US)

(72) Inventor: Mark S. Essary, Laurel, MS (US)

(73) Assignee: Howard Industries, Inc., Ellisville, MS (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/136,039

(22) Filed: Sep. 19, 2018

(65) Prior Publication Data
US 2019/0019608 A1 Jan. 17, 2019

Related U.S. Application Data

(63) Continuation-in-part of application No. 15/153,722, filed on May 12, 2016, now Pat. No. 10,107,009.

(60) Provisional application No. 62/160,422, filed on May 12, 2015.

(51) Int. Cl.
| E05B 13/10 | (2006.01) |
| H01F 27/02 | (2006.01) |
| E05B 65/02 | (2006.01) |
| H05K 5/02 | (2006.01) |
| E05C 3/12 | (2006.01) |
| E05C 3/16 | (2006.01) |
| E05C 3/40 | (2006.01) |
| E05B 67/38 | (2006.01) |

(52) U.S. Cl.
CPC ............. *H01F 27/02* (2013.01); *E05B 13/10* (2013.01); *E05B 65/02* (2013.01); *E05B 67/383* (2013.01); *E05C 3/122* (2013.01); *E05C 3/162* (2013.01); *E05C 3/40* (2013.01); *H05K 5/0208* (2013.01); *H05K 5/0221* (2013.01)

(58) Field of Classification Search
CPC ........ E05B 13/10; E05B 13/02; E05B 67/383; E05B 2067/386; E05B 73/00; E05C 1/06; E05C 1/12; E05C 5/00; E05C 5/04; H02G 3/14; Y10T 70/5779
USPC .......................................................... 70/212
See application file for complete search history.

(56) References Cited

U.S. PATENT DOCUMENTS

| 2,326,003 | A | 8/1943 | Bailey |
| 3,508,423 | A | 4/1970 | Harrell |
| 3,784,727 | A | 1/1974 | Haubein |
| 3,786,657 | A | 1/1974 | Loikitz |
| 4,078,843 | A | 3/1978 | Bozich |
| 4,113,291 | A | 9/1978 | Cameron |
| 4,280,725 | A | 7/1981 | Berkowitz |
| 4,388,991 | A | 6/1983 | Price |
| 5,739,464 | A | 4/1998 | Adkins |
| 5,783,775 | A | 7/1998 | Marusinec |
| 6,066,802 | A | 5/2000 | Reinke |
| 6,106,035 | A | 8/2000 | Hetherington |
| 6,581,419 | B1 | 6/2003 | Strodtman |
| 8,087,268 | B1 | 1/2012 | Pruitt |
| 8,581,097 | B2 | 11/2013 | Ward |

(Continued)

Primary Examiner — Suzanne L Barrett

(57) ABSTRACT

An improved latching device that secures a lift-style hood is described with inherent properties for providing increased accessibility, functionality, stability, security and safety as compared to traditional designs.

14 Claims, 10 Drawing Sheets

(56) References Cited

U.S. PATENT DOCUMENTS

| | | |
|---|---|---|
| 10,107,009 B2 * | 10/2018 | Essary .................... E05C 3/40 |
| 2002/0179606 A1 | 12/2002 | Houk, Jr. |
| 2009/0217713 A1 | 9/2009 | Loughlin |
| 2014/0158702 A1 | 6/2014 | Phillips |
| 2015/0107314 A1 | 4/2015 | Le |

* cited by examiner

LATCHING DEVICE FOR PAD-MOUNTED TRANSFORMERS AND OTHER SIMILAR EQUIPMENT

CROSS-REFERENCES TO RELATED APPLICATIONS

This application is a continuation-in-part of U.S. patent application Ser. No. 15/153,722 filed May 12, 2016, which claims priority to U.S. Provisional Application Ser. No. 62/160,422, filed May 12, 2015, which is hereby incorporated by reference.

FIELD OF THE INVENTION

The present invention is generally directed toward an improved latching device that secures the enclosure door on pad-mounted transformers or other similar equipment.

BACKGROUND OF THE INVENTION

Latching devices for the enclosure door on pad-mounted transformers and other similar equipment (collectively referred to herein as "transformers") having a handle and locking and latching mechanisms are well known in the art. Typically, the handle as well as the locking and latching mechanisms of the latching device are located near the bottom of the transformer, close to the ground. There are often long periods in which the enclosure door is not opened, and dirt, snow, road salts, sand, insects, grass, rocks and other debris or vegetation may pile up, grow or accumulate around the handle and locking and latching mechanisms. Additionally, the closer to the ground these components are located, the more exposed they are to moisture and other corrosive agents. When access is eventually required, sometimes under emergency situations, accessibility and/or the functionality of the device may be compromised. Debris or vegetation may have to be removed or dug away to gain access and the device may not operate or disengage properly due to corrosion. In addition, the lower the handle, the more bending is required for the operator to get into a position to disengage the locking mechanisms and use the handle to open the enclosure door. More specifically, operators are required to bend their backs while keeping their knees straight when opening the latching device, thus putting increased stress on the intervertebral discs in their lumbar region and increasing their risk of sciatica.

The Institute of Electrical and Electronics Engineers ("IEEE") standards require the enclosure door on a transformer to be secured with a pad lock and a security bolt which engages a threaded receptacle, whereby the enclosure door can only be unlatched and opened after the pad lock has been removed and the security bolt unscrewed and disengaged. On the traditionally designed latching device, the security bolt is attached to the enclosure door, while the threaded receptacle is mounted on the bottom sill of the transformer. The nature of this interface between the enclosure door and sill makes it susceptible to the development of alignment issues which can sometimes prevent the security bolt from properly engaging the threaded receptacle. For example, as disclosed in U.S. Pat. No. 6,066,802, the bolt provided for locking the outer hood of the transformer is carried by a latch plate fixed to the outer hood and is adapted to be inserted in a nut carried by the bottom sill of the transformer. The aforementioned patent (U.S. Pat. No. 6,066,802) is hereby incorporated by reference.

With the traditional design of the latching device, it is possible for a unit to appear as though it is completely closed, secured and locked yet not be, thus creating security and safety issues. For example, if the security bolt is depressed and the pad lock is looped through the recess cup and locked and then the door is moved or rotated to a closed or nearly closed position, the unit could mistakenly appear to be completely closed, secured and locked, but actually be accessible by simply raising the door. In addition, because of their proximity to the ground, the locking mechanisms on the traditional designs may not be easily viewable to a utility crew during drive-by safety inspections, especially if vegetation is overgrown or if debris has piled up or accumulated near the base of the transformer.

Some inventors have attempted to address, at least in part, one or more of the above-described problems with the traditionally designed latching device. For instance, U.S. Pat. No. 5,739,464 discloses a latching device design wherein a detachable enclosure cover is secured to the transformer via a curved latch arm mounted to the front tank panel and extending through the air or cable compartment to an opening in the front top center of the detachable cover. It is claimed that the locking structure at the juncture of the arm and the cover, in conjunction with tongue and groove structure on the tank panel and the enclosure, tightly secures the cover so that tamper resistance is improved. However, because the enclosure is a detachable cover which must be lifted and removed completely, as opposed to a rotating hinged door which remains attached to the transformer, this invention is only feasible if the cover is constructed of lightweight material, such as fiber or plastic, but steel is the traditional, and in fact preferred, material for almost all electrical utility applications. As such, this invention is not a practical solution for most of the industry because the weight of a detachable cover made of steel would make it unmanageable and unsafe. Also, the latch arm extending through the air or cable compartment can get in the way of cables. The aforementioned patent (U.S. Pat. No. 5,739,464) is hereby incorporated by reference.

SUMMARY OF THE INVENTION

We disclose herein an improved latching device, including the handle and locking and latching mechanisms thereof, for securing the enclosure door, including rotating hinged-type enclosure doors, on pad-mounted transformers or other similar equipment, comprised mainly of a raised handle and locking mechanisms, a latch linkage and a handle release lever. The device improves accessibility, functionality, stability, security and safety related issues as compared to traditional designs.

BRIEF DESCRIPTION OF THE DRAWINGS

Further advantages of the invention will become apparent by reference to the detailed description of preferred embodiments when considered in conjunction with the drawings.

DETAILED DESCRIPTION

Figure 1:
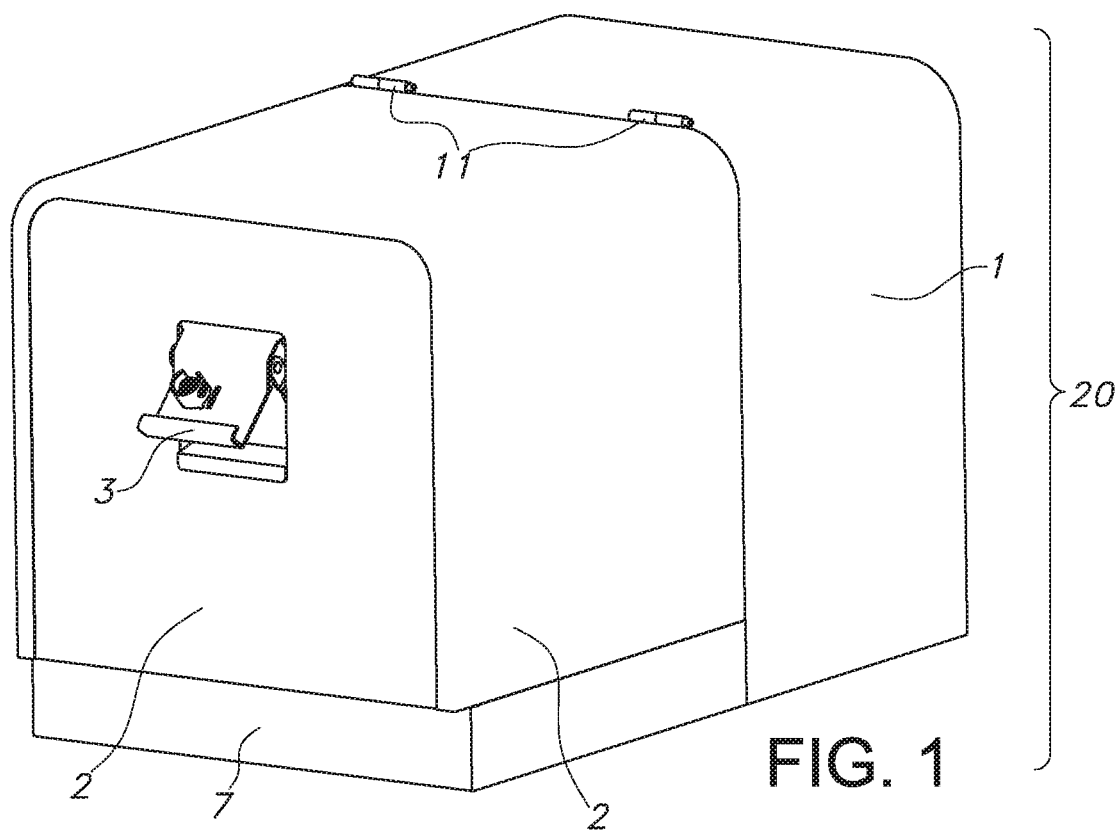
FIG. 1 is a perspective view of a pad-mounted transformer with the enclosure door in the closed position and the improved latching device in an unlatched position.
Figure 2:
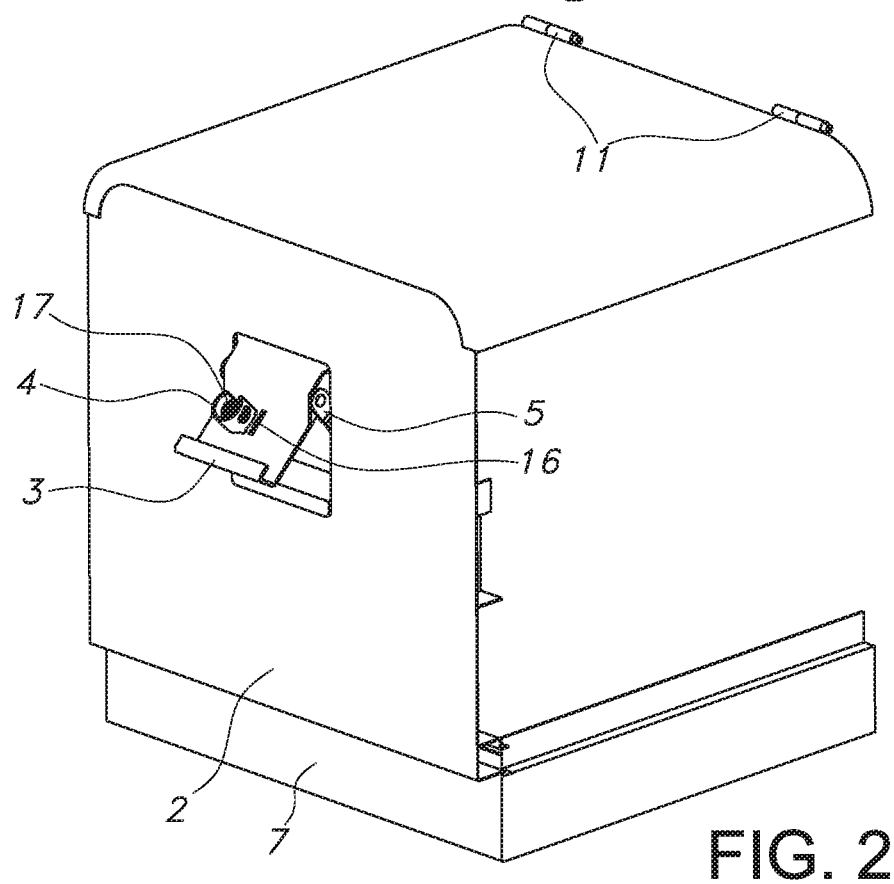
FIG. 2 is a perspective view of the enclosure door in the closed position and the improved latching device in an unlatched position.
Figure 3:
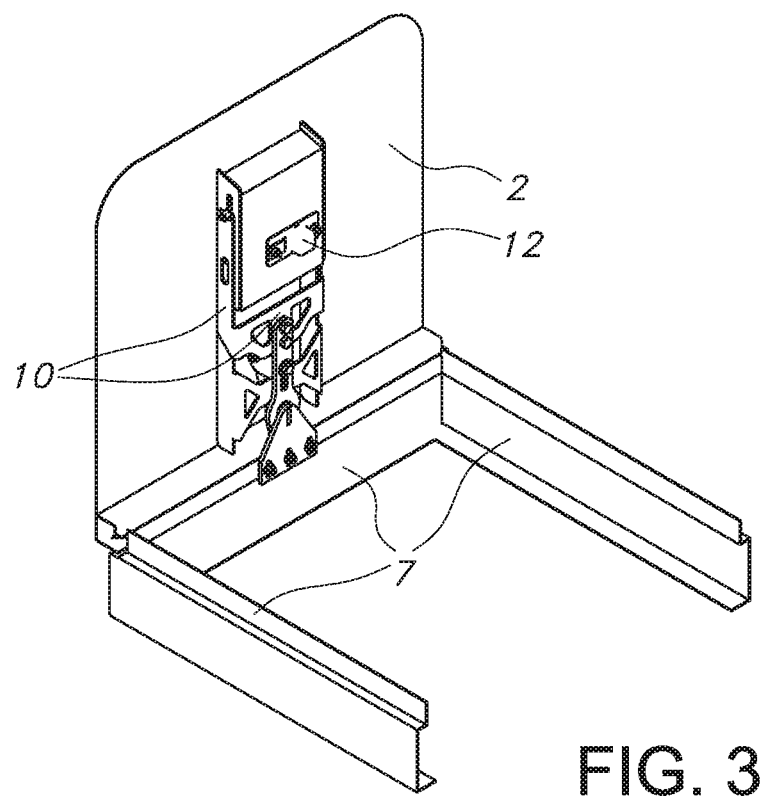
FIG. 3 is a perspective view of the enclosure door in the closed position and the improved latching device in an unlatched position.

The following detailed description is presented to enable any person skilled in the art to make and use the device. For purposes of explanation, specific details are set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the device. The present device is not intended to be limited to the embodiments shown or described, but is to be accorded the widest possible scope consistent with the principles and features disclosed herein.

Our device pictured in the drawings and described below improves the latching device by raising the handle and locking mechanisms up, away from the ground and interface between the enclosure door and the sill. This reduces the likelihood of accessibility and functionality problems associated with debris, vegetation and corrosion, and makes the device easier to view by utility crews during drive-by safety inspections. Additionally, our device improves the ergonomics of the opening process by reducing the amount of bending necessary to obtain a position needed to unlock and remove the pad lock, disengage the security bolt and start the lifting process. Finally, an embodiment of our device provides a separate latching device that can be affixed to and removed from the rotating hinged enclosure door of the pad mounted transformer as necessary. This improvement significantly increases the strength of the latching device and reduces resources required to build, repair or replace the latching device.

The drawings illustrate an embodiment of the improved latching device with raised handle 3 and locking mechanisms on a pad-mounted transformer 20, as shown in FIG. 1, with a rotating hinged enclosure door 2. The rotating hinged enclosure door 2 is connected to the tank 1 of the pad-mounted transformer 20 via hinges 11 so that the rotating enclosure door 2 opens up and away from the tank 1 when lifted up by an operator.

FIGS. 2-7 depict an embodiment of the pad-mounted transformer 20 with the rotating hinged enclosure door 2 closed and the improved latching device in an unlatched position (raised handle 3 pulled out).

The improved latching device is comprised primarily of a raised handle 3, raised locking mechanisms comprised of a recess cup 4 for the security bolt 17 and pad lock 18, and a threaded receptacle 12 which receives the security bolt 17, and a lock hasp 15. When the rotating hinged enclosure door 2 is closed and latched, the pad lock 18 is looped through the lock hasp 15 and recess cup 4, and covers the head of the security bolt 17.

Figure 4:
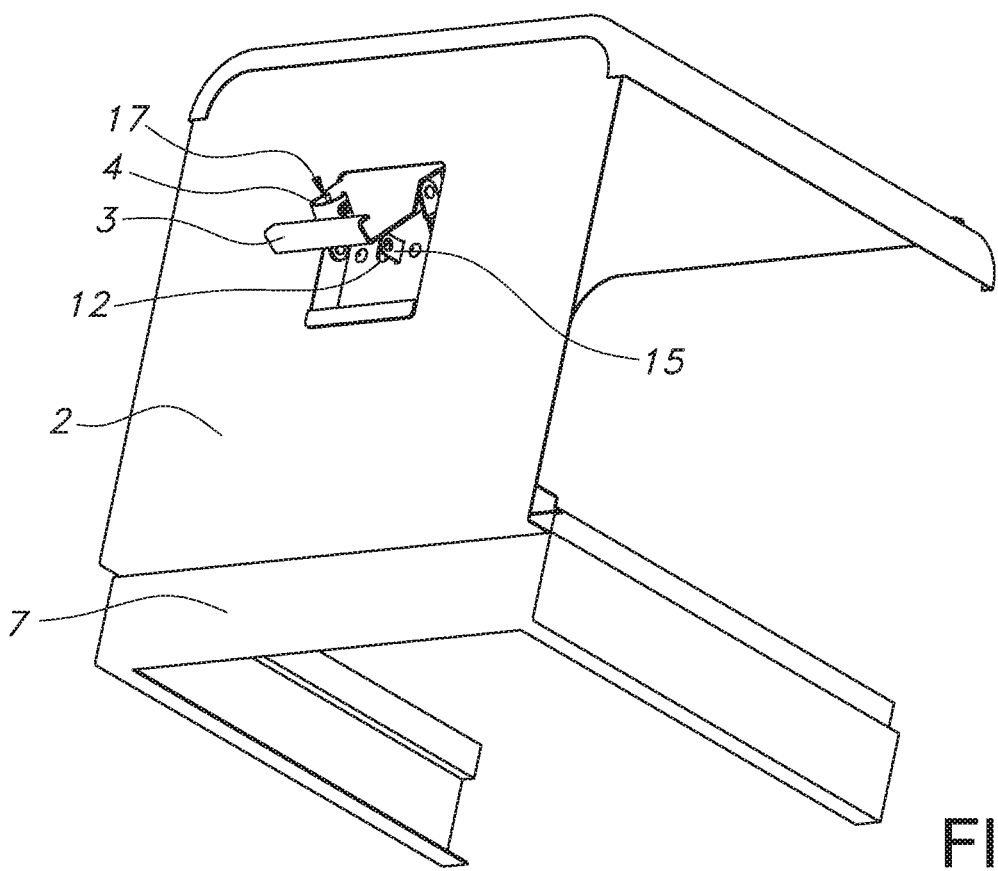
FIG. 4 is a perspective view of the enclosure door in the closed position and the improved latching device in an unlatched position.

To open the rotating hinged enclosure door 2, the operator would remove the pad lock 18, use a socket wrench or other tool to unscrew the security bolt 17 and disengage it from the threated receptacle 12 allowing the raised handle 3 to be lifted up (pulled out) so that the recess cup 4 will no longer be aligned with the lock hasp 15 as will be appreciated from FIG. 4 depicting the device in the unlatched position. Pulling the raised handle 3 out causes the latch loop 8 to move down, allowing the rotating hinged enclosure door 2 to be opened.

An embodiment of the device includes a toggle action to the mechanics of the latching device. This toggle action allows significant forgiveness and tolerances with respect to potential alignment issues when the enclosure door is latched and secured, resulting in improved security, functionality and tamper resistance. The toggle action also adds an element of leverage which makes it easier to unlatch (and latch) the rotating hinged enclosure door 2 in the event of obstruction or corrosion. Our design largely eliminates problems with alignment of the locking components by positioning the security bolt 17, the threaded receptacle 12, the lock hasp 15, and the pad lock 18 features all on the rotating hinged enclosure door 2 and in close proximity to each other as compared to traditional designs where the security bolt is attached to the enclosure door, while the threaded receptacle is mounted on the bottom sill of the transformer. In addition, our design improves safety by making it less likely an enclosure door could mistakenly appear to be completely closed, secured and locked when it is not.

Figure 5:
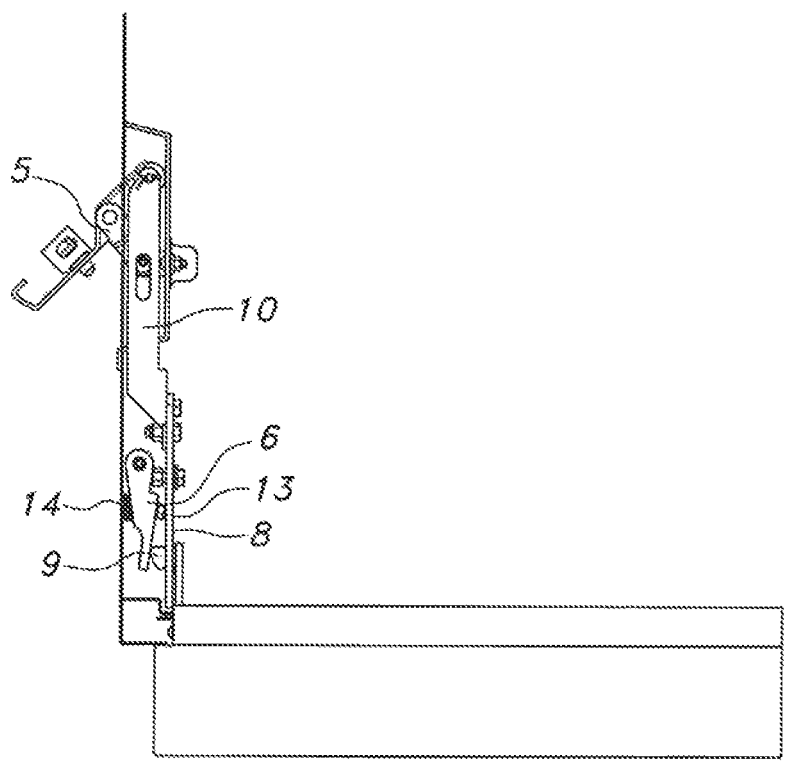
FIG. 5 is a side elevational view of the enclosure door in the closed position, the improved latching device in an unlatched position, and the handle release lever in the released position.
Figure 6:
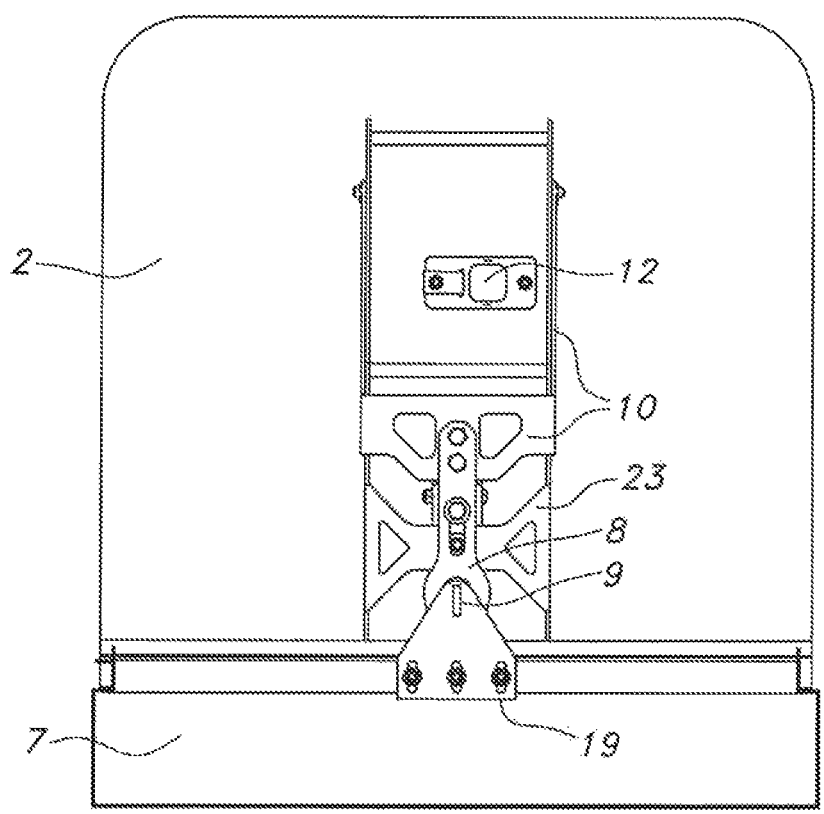
FIG. 6 is a rear elevational view of the enclosure door in the closed position and the improved latching device in an unlatched position.
Figure 7:
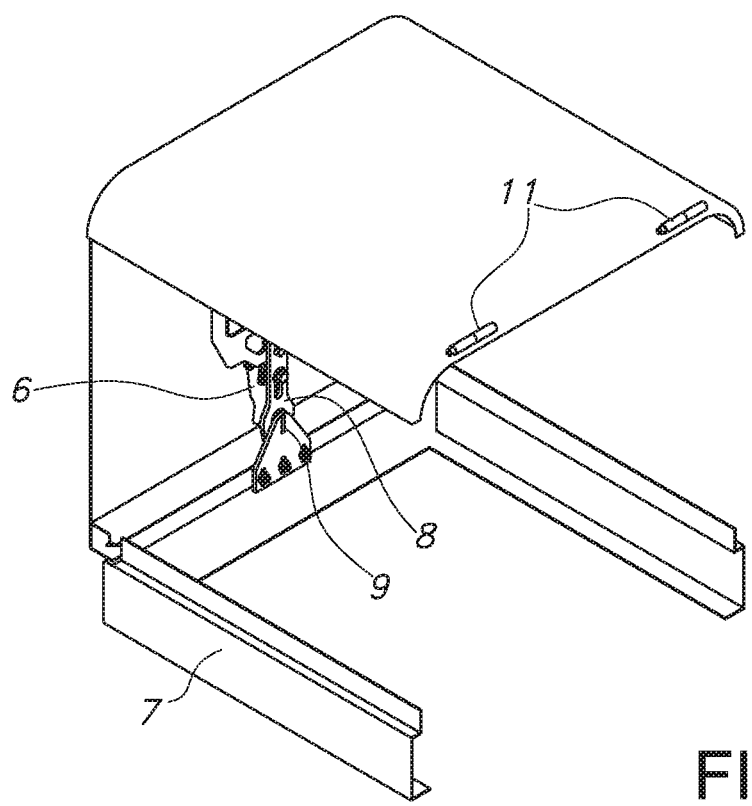
FIG. 7 is a perspective view of the enclosure door in the closed position and the improved latching device in an unlatched position.

The raised handle 3 and the recess cup 4 on the handle are located on the external surface of the front panel of the rotating hinged enclosure door 2 and, together, hold the security bolt 17 captive. As shown in FIG. 5, the threaded receptacle 12 is mounted directly adjacent thereto on the internal surface of the front panel of the rotating hinged enclosure door 2.

The latching mechanisms, including the handle release lever 6, a latch loop 8 and a latch pin 9, are located further below, at the interface between the enclosure door 2 and sill 7 attached to the frame 23. The frame 23 is located on the inside of the rotating hinged enclosure door 2 and includes cross bracing. Because the raised handle 3 and locking mechanisms are located at a distance further above the sill 7, as compared to traditionally designed latching devices, they are more easily accessible by the operator and the likelihood of accessibility and functionality issues from obstruction and/or corrosion is lessened. While the raised handle 3 and locking mechanisms are functional at various distances above the sill 7, an embodiment of this invention contemplates that the raised handle 3 and locking mechanisms are located at the top of the enclosure door 7 and/or closer to the top of the enclosure door 7 than the bottom of the enclosure door 7. Also, because the recess cup 4, security bolt 17, threaded receptacle 12, and lock hasp 15 are all mounted on the enclosure door 2, alignment issues with respect to these locking mechanisms are minimized.

A potential embodiment of the invention includes placement of the latch loop 8 between the frame 23 and rotating hinged enclosure door 2. This design reduces the number of parts necessary for the device to function, while making the structure of the device stronger.

Figure 17:
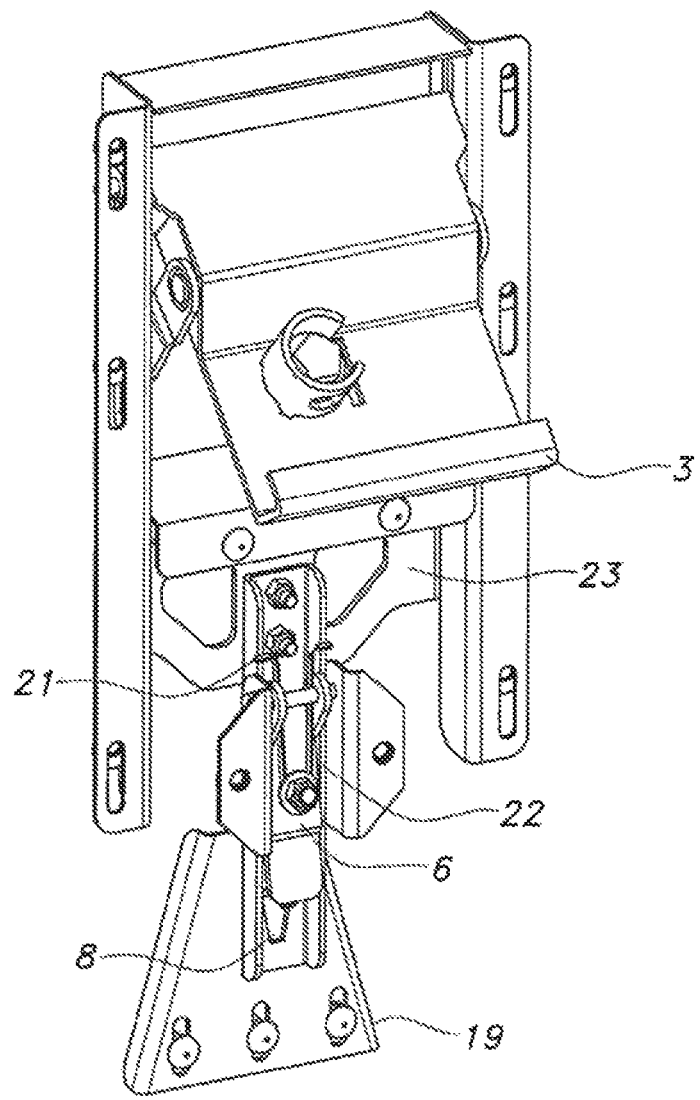
FIG. 17 is a perspective view of an embodiment of the improved latching device.

It is also contemplated in this embodiment that the latch loop 8 is inside a tunnel 22 a distance above the latch plate 19 and is a stamped channel making a stronger and less expensive assembly, as shown in FIG. 17. A torsion spring 21 is used to rotate the handle release lever 6 and apply pressure on the latch loop 8, to place it in the best location prior to engaging the latch pin 9. This design reduces the number of close fitting parts that could be fouled by the elements, such as dirt or ice.

In an embodiment of the invention, the raised handle 3 cannot be moved into a latched position (pushed in) unless the rotating hinged enclosure door 2 is fully closed.

As shown in FIGS. 2-7, when the enclosure door 2 is unlatched by pulling the raised handle 3 out into the unlatched (open) position, the latch loop 8 moves down and disengages the latch pin 9 by centering the latch pin 9 in the opening of the latch loop 8, without contact. From this position, the rotating hinged enclosure door 2 is free to be opened, in this case by rotating it up on the hinges 11.

In a potential embodiment of the invention, the latch loop 8 is capable of moving away from the latch pin 9, thus providing an additional degree of motion.

Figure 8:
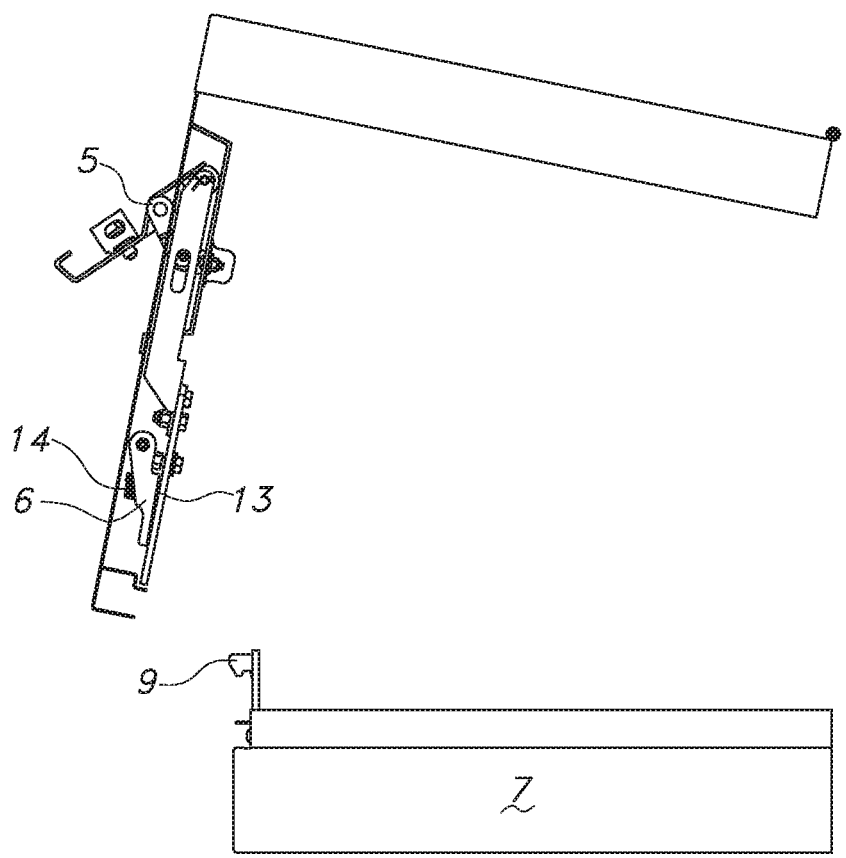
FIG. 8 is a side elevational view of the enclosure door in the open position, the improved latching device in an unlatched position, and the release lever in the restraining position.
Figure 9:
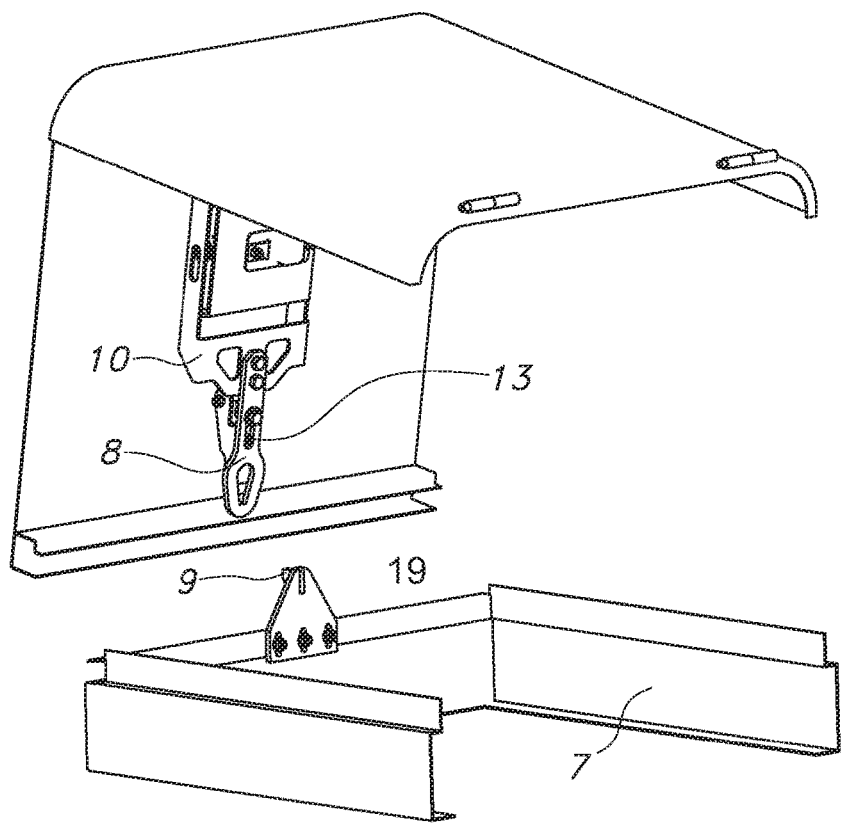
FIG. 9 is a perspective view of the enclosure door in the open position, the improved latching device in an unlatched position, and the release lever in the restraining position.
Figure 10:
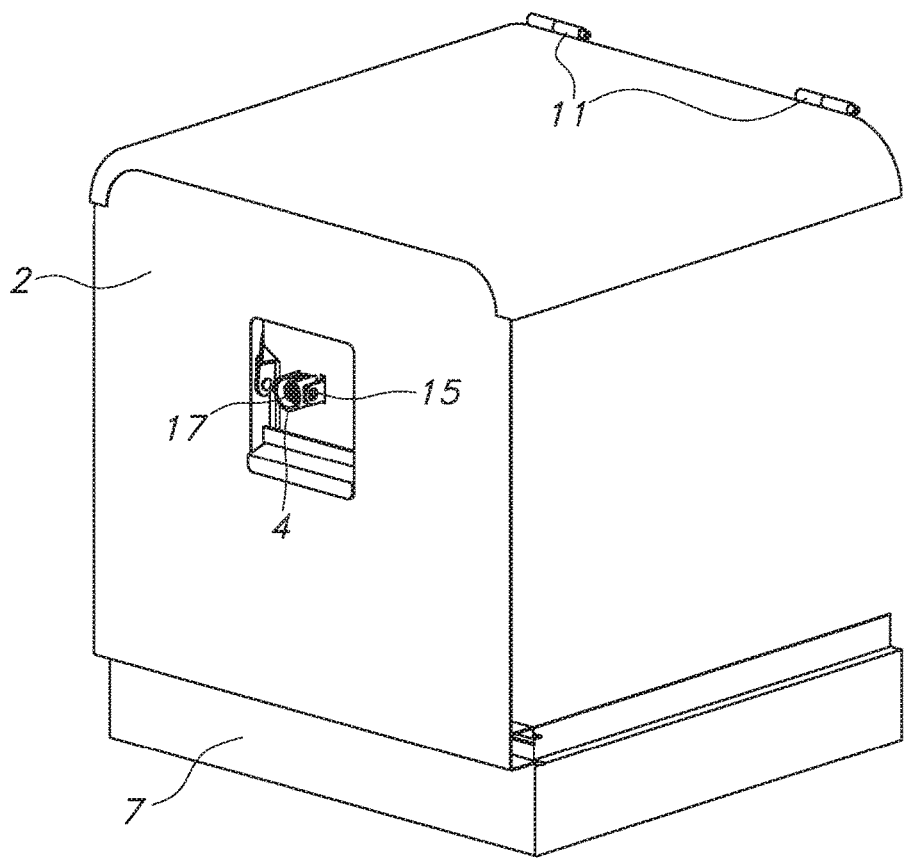
FIG. 10 is a perspective view of the enclosure door in the closed position, the improved latching device in a latched position, and the release lever in the released position.
Figure 11:
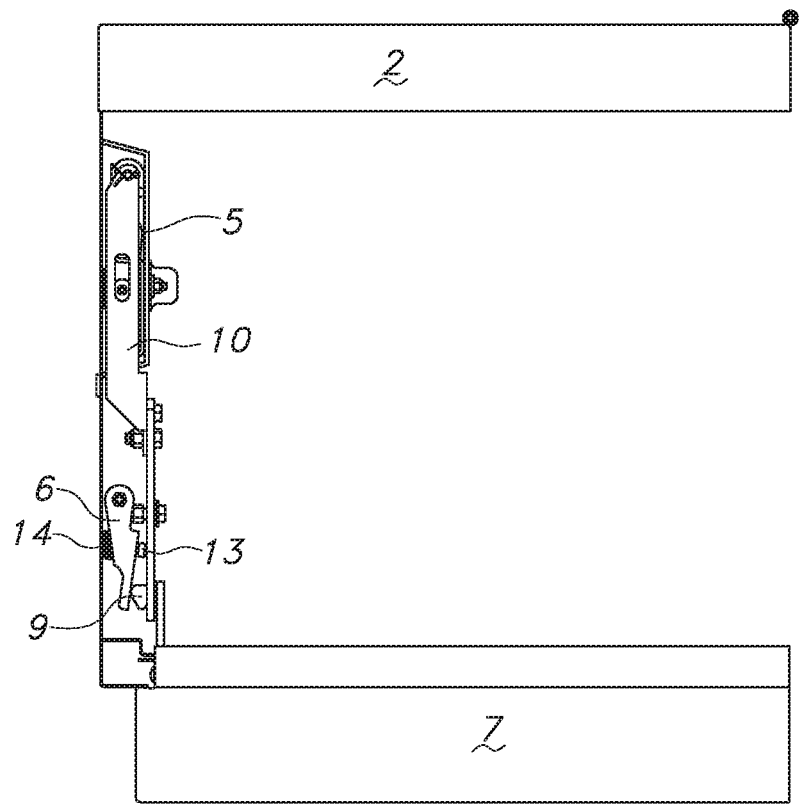
FIG. 11 is a side elevational view of the enclosure door in the closed position, the improved latching device in a latched position, and the release lever in the released position.
Figure 12:
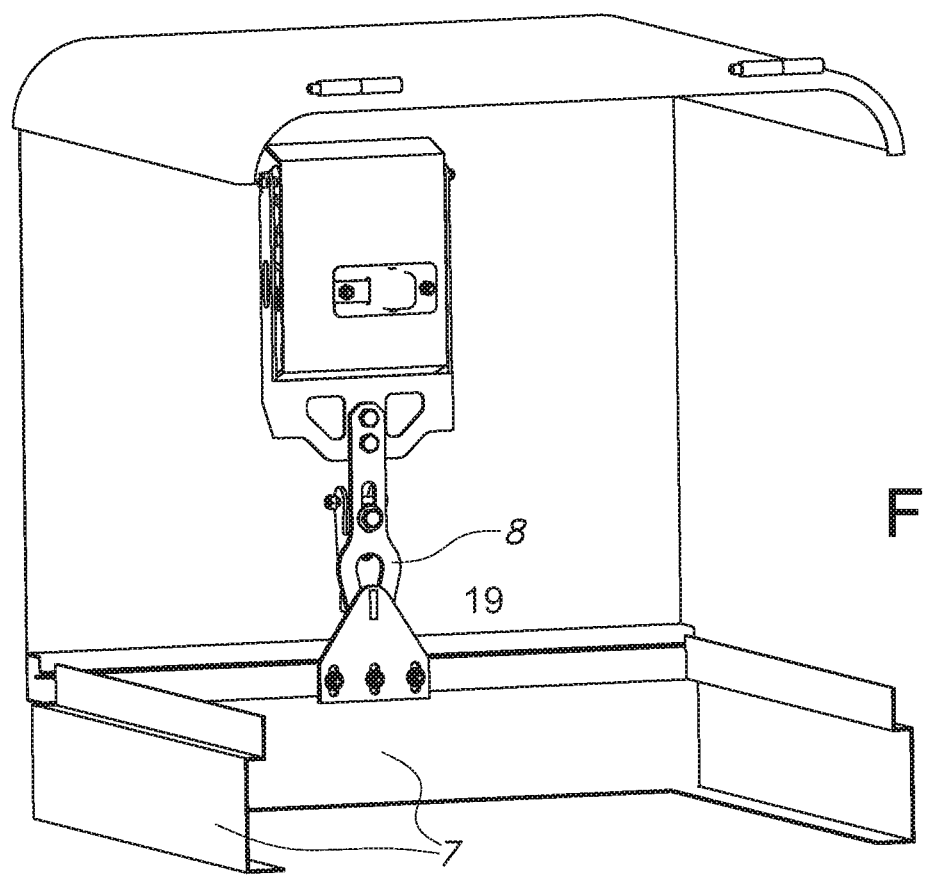
FIG. 12 is a perspective view of the enclosure door in the closed position, the improved latching device in a latched position, and the release lever in the released position.
Figure 13:
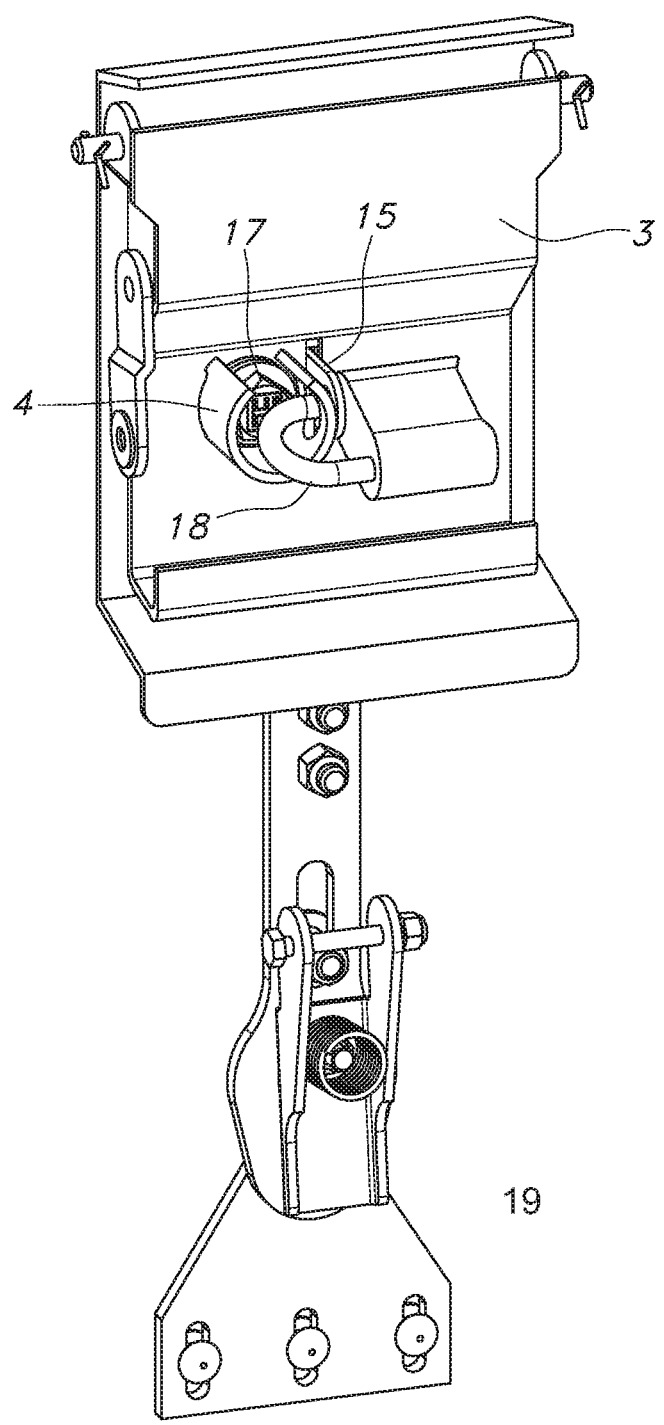
FIG. 13 is a perspective view of the locking and latching mechanisms of the improved latching device in a latched and locked position.
Figure 14:
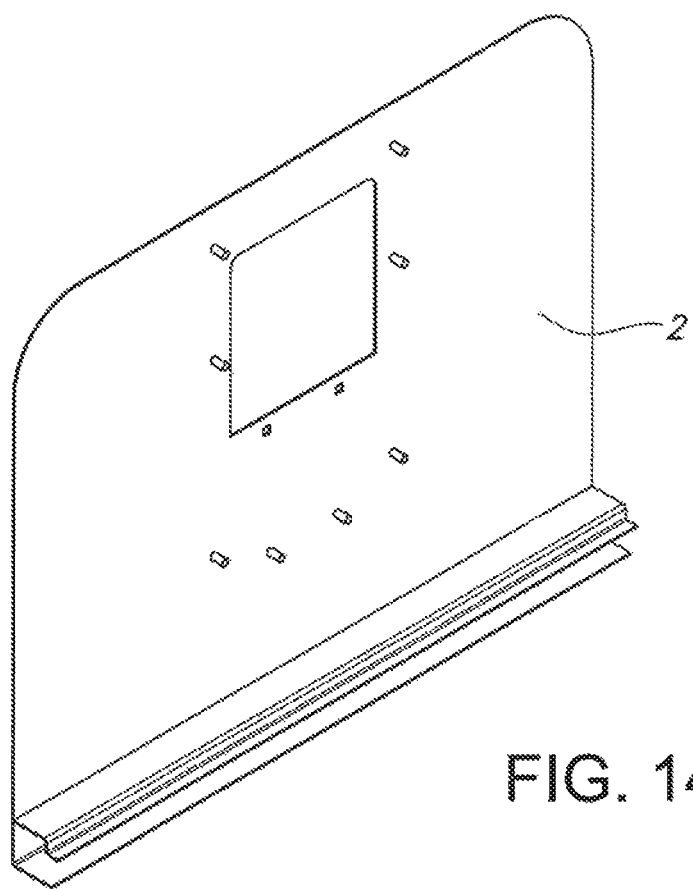
FIG. 14 is a perspective view of the front panel of rotating hinged enclosure door only.
Figure 15:
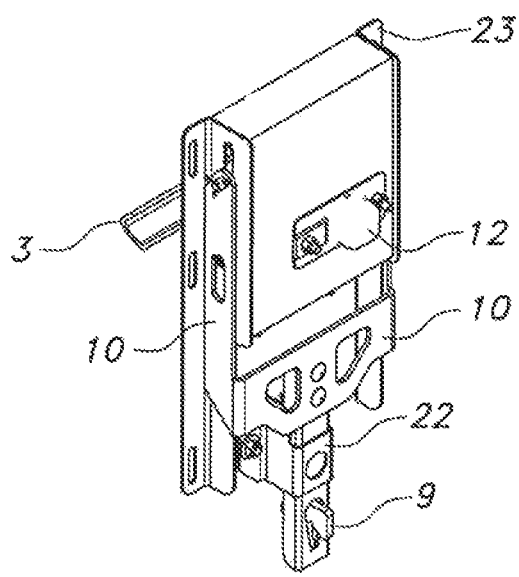
FIG. 15 is a perspective view of an embodiment of the improved latching device only in unlatched position.
Figure 16:
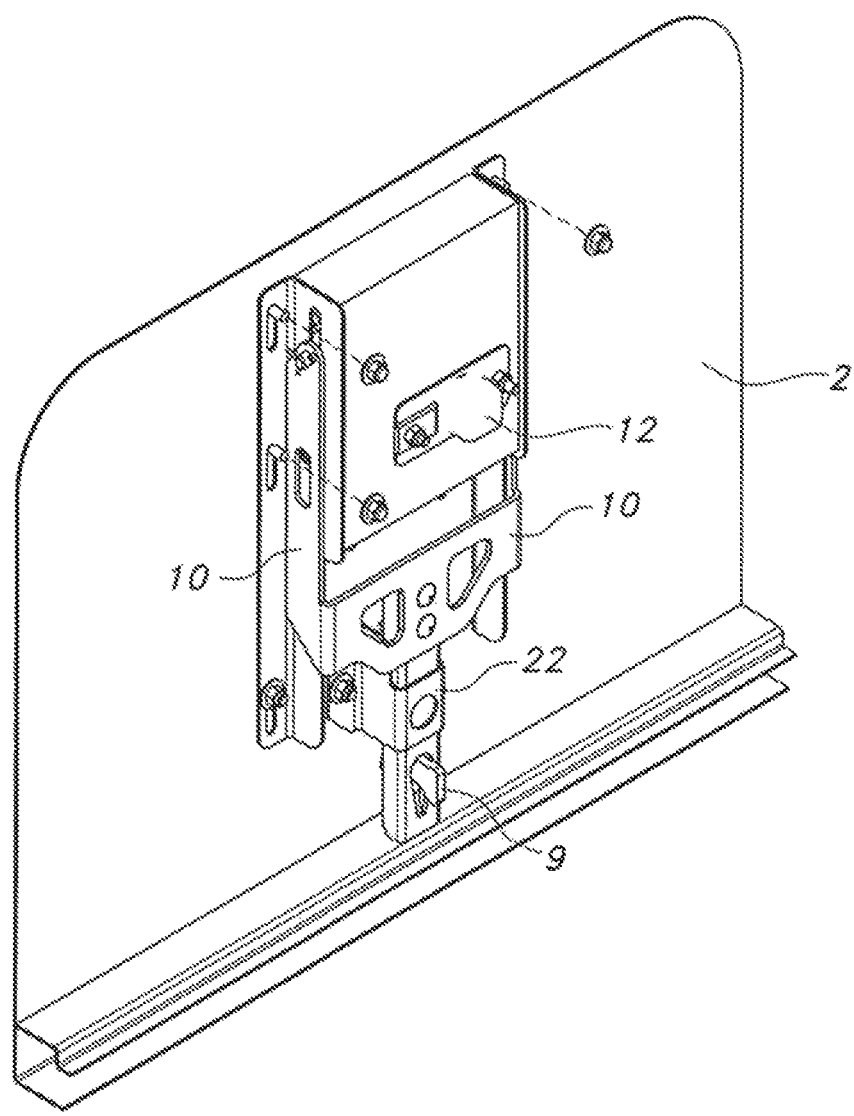
FIG. 16 is a perspective view of an embodiment of the improved latching device being affixed to the rotating hinged enclosure door of the pad-mounted transformer via bolts and studs.

As seen in FIGS. 8 and 9, when the enclosure door is pulled away from the sill 7 in an embodiment of the invention, the raised handle 3 will remain in the unlatched (pulled out) position and cannot be pushed back into the latched position because the release lever pin 13 mounted on the spring-powered handle release lever 6 is engaged with and restraining the latch loop 8. The raised handle 3 can only be released from this position (pushed back in) when, upon the enclosure door 2 being completely closed, the handle release lever 6 is pushed back against the release lever spring 14 by the latch pin 9 and the release lever pin 13 is disengaged from the latch loop 8 as can be appreciated from FIGS. 10-12 depicting the device in the latched position. As such, even if a pad lock 18 was affixed to the recess cup 4 and the rotating hinged enclosure door 2 was then lowered to a closed or nearly closed position, the raised handle 3 on our design, as compared to traditional designs, could still not be pushed completely into a flush or latched position and thus the rotating hinged enclosure door 2 could not as easily be mistaken as closed, secured and locked, when it was not. Additionally, even if the release lever 6 was intentionally defeated to release the raised handle 3 while the rotating hinged enclosure door 2 was in the open position, with the security bolt 17 fully threaded into the receptacle 12 and a pad lock 18 affixed to the recess cup 4 through the lock hasp 15, the rotating hinged enclosure door 2 cannot be fully closed into a flush position because latch loop 8 would contact the front of latch pin 9 and, thus, the rotating hinged enclosure door 2 could not as easily be mistaken as closed, secured and locked, when it was not.

As shown in FIG. 5, when the enclosure door 2 is fully closed, the handle release lever 6 is depressed which disengages the release lever pin 13 from the latch loop 8. This position allows the raised handle 3 to be pushed in, which operates the latch linkage 5 on the inside of the front panel of the enclosure door 2, which is connected to a connection link 10, which in turn raises the latch loop 8 to engage the latch pin 9, as shown in FIG. 11. Engaging said latch pin 9 pulls the enclosure door 2 down hard on the sill 7 allowing the lock hasp 15 to pass through the hasp slot 16 so that the security bolt 17 can be engaged and the pad lock can be attached to the pad mounted transformer 20.

The toggle action of the latch loop 8 allows forgiveness and tolerances at the interface between the enclosure door 2 and sill 7 which ensures that when the enclosure door 2 is closed and the raised handle 3 is pushed in, the various components are in a position to properly latch and tightly secure the enclosure door 2 to the sill 7. This improves the functionality and tamper resistance of the unit. The toggle action also provides leverage when unlatching (or latching) the device in the event of obstruction or corrosion.

An embodiment of the device is composed of steel manufactured using steel metal stamping where laser, plasma or water jet generated blanks are folded on stamping press dies. This method of manufacture can be utilized to create fewer parts of different shapes and sizes necessary to accomplish the improved function of the latching device, all of which are contemplated by this device.

Alternate methods of manufacture of the device including casting, molding, formed wire parts or machining of parts and include alternate materials, such as plastic.

The latching mechanisms can be assembled by the use of rivets, caps, screws and nuts, fasteners, pins, other fastening mechanisms or welding.

The advantages of the device have been shown in ergonomic evaluations. The results of the evaluation showed that the improved latching device provides a clear ergonomic and postural change deviation that allows the operator to effectively choose the method of lifting. Further, the improved latching device gives each operator the opportunity to perform a stoop lift or squat lift with minimal postural deviations and diminishes the risk of substantial harm to the lumbar spine. Finally, the operators presented with the ability to decrease the amount of time required to perform the essential task when utilizing the improved latching device. Additionally, due to device being located at a distance above the sill 7, debris around the pad-mounted transformer 20 would not substantially restrict the ability to ambulate the handle during lifting.

It should be appreciated that different arrangements of the basic parts are possible to achieve the same function. Additionally, material gages of parts could be changed. Some parts could be further combined into a single part to provide multiple functions.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

The invention has been described with reference to various specific and preferred embodiments and techniques. However, it should be understood that many variations and modifications may be made while remaining within the spirit and scope of the invention. It will be apparent to one of ordinary skill in the art that methods, devices, device elements, materials, procedures and techniques other than those specifically described herein can be applied to the practice of the invention as broadly disclosed herein without resort to undue experimentation. All art-known functional equivalents of methods, devices, device elements, materials, procedures and techniques described herein are intended to be encompassed by this invention. Whenever a range is disclosed, all subranges and individual values are intended to be encompassed. This invention is not to be limited by the embodiments disclosed, including any shown in the drawings or exemplified in the specification, which are given by way of example and not of limitation.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

I hereby claim:

1. A latching device for securing the enclosure door of a pad mounted transformer or other similar equipment comprising:
   a. a handle located on an enclosure door at a distance above a sill of the pad mounted transformer;
   b. latching mechanisms for connecting the enclosure door to the sill of the pad mounted transformer further comprising a latch linkage, a latch loop and pin which operate as a toggle mechanism, and a handle release lever; and
   c. locking mechanisms for securing the enclosure door in a closed position located on the enclosure door at a distance above the sill of the pad mounted transformer; wherein the latching device is a separate component affixed to the enclosure door of the pad mounted transformer.

2. The device of claim 1 wherein said enclosure door is a rotating hinged enclosure door.

3. The device of claim 1 wherein said latching device is composed of steel.

4. The device of claim 1 wherein said latching device is molded from plastics.

5. The locking mechanisms of claim 1 further comprising:
   a. a recess cup through which a security bolt and pad lock can be placed;
   b. a threaded receptacle configured to receive the security bolt;
   c. a latch linkage; and
   d. a lock hasp.

6. The latch linkage of claim 5 wherein said latch linkage includes the use of welding.

7. The latching device of claim 1 wherein the latching device is affixed to the rotating hinged enclosure door of the pad-mounted transformer via bolts.

8. The latching device of claim 1 wherein the latching device is affixed to the rotating hinged enclosure door of the pad-mounted transformer via studs.

9. The latching device of claim 1 wherein the latching device is affixed to the rotating hinged enclosure door of the pad-mounted transformer via screws.

10. A latching device for securing the enclosure door of a pad mounted transformer or other similar equipment comprising:
    a. a handle located on an enclosure door at a distance above a sill of the pad mounted transformer;
    b. latching mechanisms for connecting the enclosure door to the sill of the pad mounted transformer further comprising a latch linkage, a latch loop and pin which operate as a toggle mechanism, and a handle release lever; and
    c. locking mechanisms for securing the enclosure door in a closed position located on the enclosure door at a distance above the sill of the pad mounted transformer.

11. The device of claim 10 wherein the handle is only capable of being lowered when the enclosure door is fully closed.

12. The device of claim 10 wherein the handle is only capable of being lowered when the handle release lever is depressed by the latch pin.

13. The latching mechanisms of claim 10 further comprising a spring for rotating the handle release lever and applying pressure on the latch loop.

14. The device of claim 10 wherein upon lowering the handle prior to closing the enclosure door, the latch loop contacts the front of the latch pin preventing the enclosure door from being fully closed.

* * * * *